US 6,466,032 B2

(12) United States Patent
Klaar

(10) Patent No.: US 6,466,032 B2
(45) Date of Patent: Oct. 15, 2002

(54) METHOD AND APPARATUS FOR IDENTIFICATION OF THE DISCONNECTION OF A PROTECTION DEVICE

(75) Inventor: Jürgen Klaar, Neukirchen-Vluyn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/853,473

(22) Filed: May 11, 2001

(65) Prior Publication Data

US 2001/0033176 A1 Oct. 25, 2001

Related U.S. Application Data

(63) Continuation of application No. PCT/EP99/08210, filed on Oct. 29, 1999.

(30) Foreign Application Priority Data

Nov. 11, 1998 (EP) .............................. 98121404

(51) Int. Cl.$^7$ ........................ G01R 31/08; G01R 31/02; G01N 27/60
(52) U.S. Cl. ........................ 324/536; 324/424; 324/456
(58) Field of Search ................................ 324/536, 424, 324/423, 520; 361/45

(56) References Cited

U.S. PATENT DOCUMENTS

| H536 H | * | 10/1988 | Stickland et al. ........... 324/456 |
| 5,185,685 A | * | 2/1993 | Tennis et al. ................. 361/45 |
| 5,434,509 A | * | 7/1995 | Blades ........................ 324/536 |
| 5,825,598 A | * | 10/1998 | Dickens et al. ............... 361/42 |
| 5,834,940 A | * | 11/1998 | Brooks et al. ............... 324/424 |
| 5,847,913 A | * | 12/1998 | Turner et al. ................. 361/93 |
| 5,946,179 A | * | 8/1999 | Fleege et al. ................. 361/93 |
| 6,242,993 B1 | * | 6/2001 | Fleege et al. ................. 335/18 |

FOREIGN PATENT DOCUMENTS

| EP | 0508638 A2 | 10/1992 |
| FR | 2.218.640 | 9/1974 |

* cited by examiner

Primary Examiner—N. Le
Assistant Examiner—Wasseem H. Hamdan
(74) Attorney, Agent, or Firm—Laurence A. Greenberg; Werner H. Stemer; Ralph E. Locher

(57) ABSTRACT

The invention relates to a method and apparatus for identification of the disconnection of a current protection device, in particular of a protection device which is connected in series with a semiconductor component and is arranged on a rotating shaft. According to the invention, electromagnetic pulses which are produced during disconnection of the current protection device are received by an antenna which is arranged in the vicinity of the protection device.

14 Claims, 3 Drawing Sheets

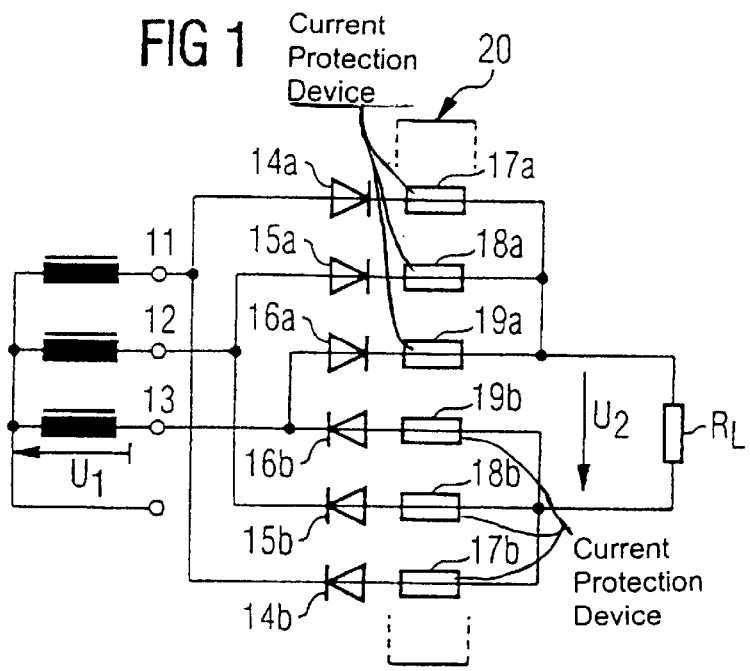
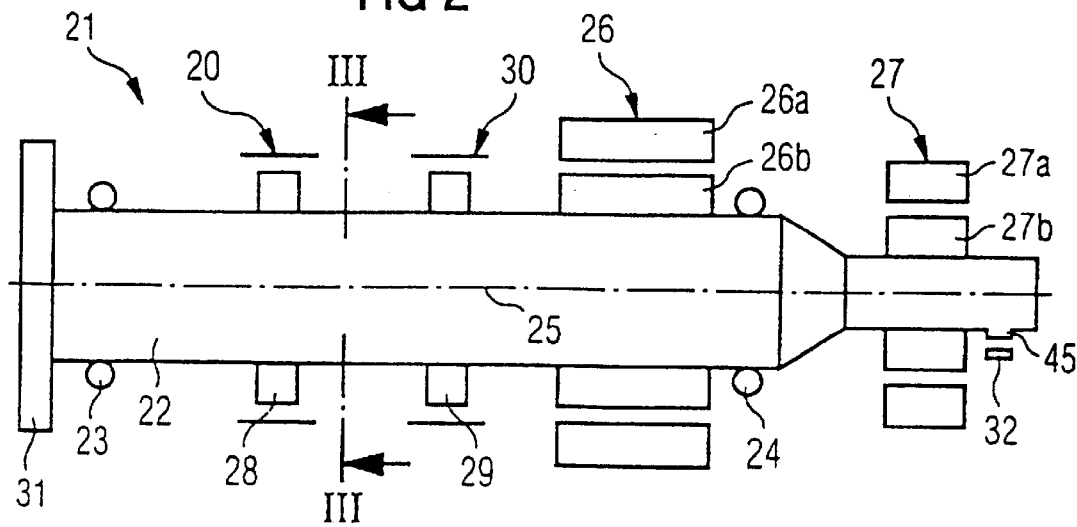

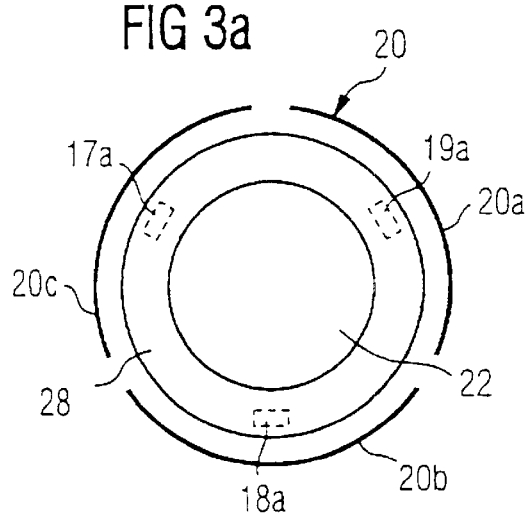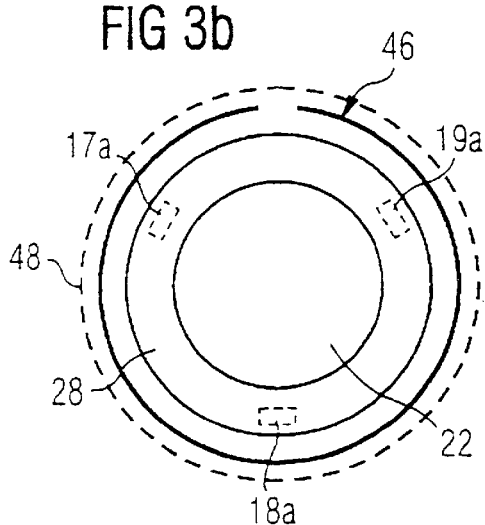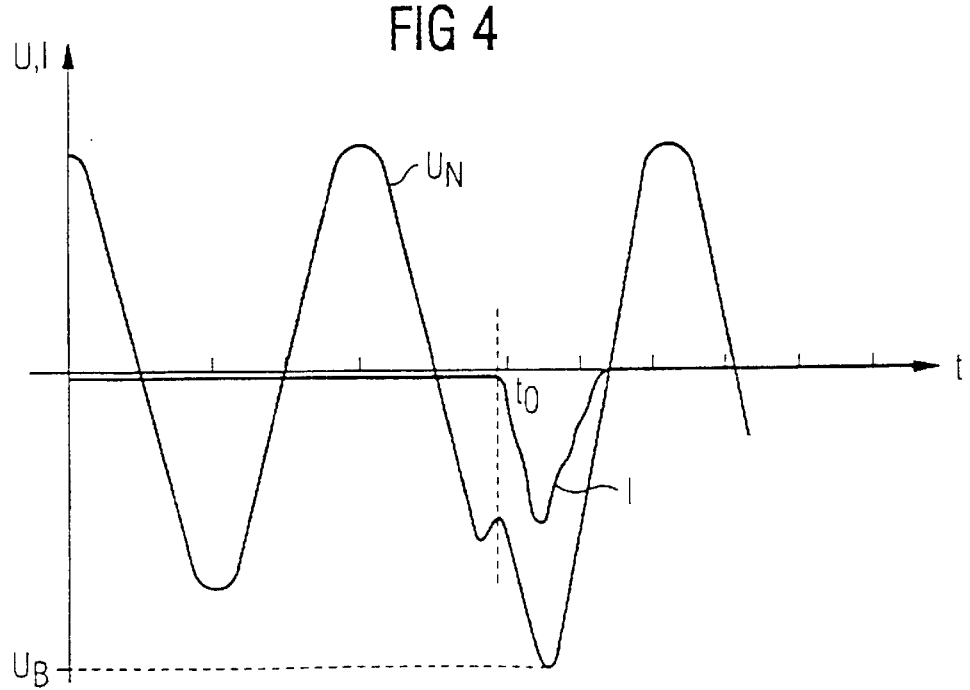

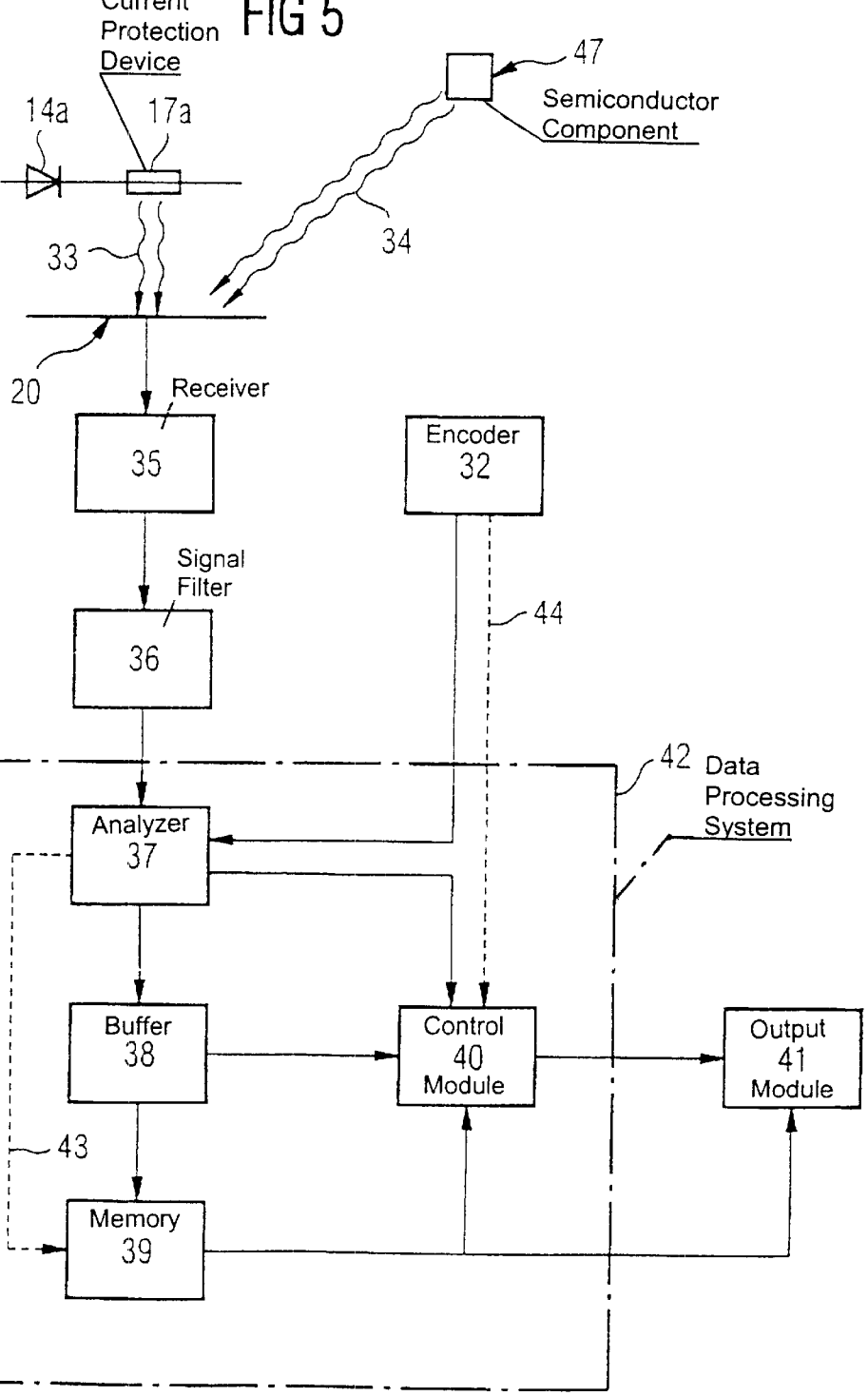

METHOD AND APPARATUS FOR IDENTIFICATION OF THE DISCONNECTION OF A PROTECTION DEVICE

CROSS-REFERENCE TO RELATED APPLICATION

This application is a continuation of copending International Application No. PCT/EP99/08210, filed Oct. 29, 1999, which designated the United States.

BACKGROUND OF THE INVENTION

Field of the Invention

The present invention relates to a method and device for identification of the disconnection of a current protection device, in which electromagnetic pulses emitted from the protection device are received and are checked for electromagnetic pulses produced during disconnection of the protection device. In addition, the present invention relates to an apparatus for identifying the disconnection of a protection device, in which at least one antenna is provided, which is arranged in the vicinity of the protection device and receives electromagnetic pulses produced during disconnection of the protection device.

The term protection device as used herein includes circuit breakers, or breakers in general, and fuses.

Protection devices such as these are used in particular in electrical systems such as rectifier systems having semiconductor components. The semiconductor components are protected by protection devices. If a semiconductor component fails, for example as a result of breakdown, the circuit path that has become destroyed is selectively isolated from the rest of the electrical system by disconnection of the associated protection device. When a number of semiconductor components are connected in parallel, operation can generally be maintained by virtue of the electrical configuration. However, in order to monitor the system, the disconnection of the protection device must be identified and indicated.

It has become known for protection devices to have integrated indicators to identify the disconnection of the protection device. In many cases, flags are used, which are set when the protection device is disconnected. In the case of a protection device arranged on a rotating shaft, these flags are set by centrifugal force. Monitoring is then carried out visually at defined intervals, based on empirical values. The rotating shaft is illuminated with a stroboscope for observation, with the frequency of the stroboscope being matched to the rotation speed of the shaft. This manual monitoring requires time and experienced personnel, and is dependent on the stroboscope control quality. Alternatively or additionally, monitoring can be carried out by means of video cameras. This type of monitoring is costly and requires experienced personnel to check the image which is recorded by the video camera and is transmitted to a suitable point.

The disconnection of a protection device can also be identified by monitoring the current flowing through the protection device. For example, a Hall probe can be used to monitor the magnetic field produced by the current flow. As soon as a current interruption is detected, this can be traced back to a disconnection of the protection device. However, monitoring of the current flowing through the protection device is highly complex. When a current interruption is identified, then the disconnection of the protection device is first of all confirmed by visual examination. Furthermore, machines which are not provided with electronic protection device monitoring from the start can be retrofitted only with major effort. Furthermore, retrofitting is feasible only if there is sufficient installation space available in the machine.

It has become known from published European patent application EP 0 508 638 A2 for the electromagnetic field emitted from a stationary electrical conductor to be monitored by using an antenna. However, such monitoring does not make it possible to identify a protection device rotating on a rotating shaft, particularly when there are a number of protection devices on the shaft.

SUMMARY OF THE INVENTION

The object of the present invention is to provide a method and device for monitoring a breaker which overcomes the above-noted deficiencies and disadvantages of the prior art devices and methods of this general kind, and which provides for simple monitoring, which can be retrofitted, is reliable and operates automatically, for identification of a protection device which is being disconnected.

With the above and other objects in view there is provided, in accordance with the invention, a method of identifying a disconnection of a protection device, which comprises:

placing a protection device on a rotatable shaft and connecting the protection device in series with a semiconductor component;

receiving electromagnetic pulses emitted from the protection device and from any other components which may be present and checking for electromagnetic pulses produced during disconnection of the protection device; and detecting a rotation position of the shaft via an encoder and linking the rotation position to the received electromagnetic pulses.

With the above and other objects in view there is also provided, in accordance with the invention, an apparatus for identifying a disconnection of a protection device, in particular an apparatus for carrying out the novel method. The apparatus comprising:

at least one antenna disposed in a vicinity of a protection device arranged on a rotating shaft and connected in series with a semiconductor component, said antenna receiving electromagnetic pulses produced during a disconnection of the protection device; and an encoder disposed to detect a rotation position of the shaft.

In other words, the protection device is arranged on a rotating shaft and the rotation position of the shaft is detected via an encoder, and is linked to the received pulses. In structural terms, the protection device according to the invention is arranged on a rotating shaft, and an encoder is provided for detection of the rotation position of the shaft.

The idea of the invention is based on a high disconnection current being present briefly on disconnection of the protection device. When using a fuse link, arcs are formed on the melting conductors. The high disconnection current and the arc voltage produce electromagnetic pulses. When used in an exciter machine with rotating semiconductors and protection devices, for example in a rectifier circuit, the time duration and the frequency of the electromagnetic pulses depend on the rotation speed of the rotating shaft, the inductance in the load circuit and the disconnection time.

These pulses are received and are used as a signal for disconnection of the protection device.

The protection device is generally disconnected in the blocking phase when the voltage load is at its maximum, when the semiconductor component fails. The pulse duration of the electromagnetic pulses on disconnection of a protection device is thus a number of times greater than what are referred to as the hole storage effect peaks of the individual semiconductor components used for rectification. These peaks are caused by inductances in a downstream load. The voltage applied to the semiconductor components builds up across the semiconductor components owing to these inductances. On breakdown, the voltage rises severely to beyond the peak value of the externally applied voltage, and then falls back again. The peaks can be dissipated by means of appropriate circuitry with resistors and capacitors, and occur cyclically.

The electromagnetic pulses produced on disconnection of a protection device in comparison occur only once per protection device and the pulse length and pulse magnitude differ from those of pulses which are emitted from any other components which may be present, such as the semiconductor components. It is thus possible to reliably identify the disconnection of the protection device by receiving all the emitted electromagnetic pulses and checking for electromagnetic pulses produced on disconnection of the protection device.

The rotation position of the shaft is detected via an encoder and is linked to the received signals. The encoder on the shaft makes it possible to determine the position of the protection device. Normally, in the case of an exciter machine for turbogenerators, a number of detection devices revolve on a common path. As stated initially, the disconnection in the protection device generally takes place at the maximum voltage load in the blocking phase of the semiconductor element. It is possible to use the rotation position of the shaft to determine that protection device which was loaded with the greatest voltage at the time of disconnection. Normally, this protection device is disconnected. The disconnected protection device can thus be determined by the link to the rotation position of the shaft via the encoder.

The antenna is arranged in the vicinity of the protection device, so that the protection device is located in the reception area of the antenna.

The apparatus according to the invention operates without contact, and the space required for the antenna is very small. Retrofitting in already existing systems, in particular in exciter machines for turbogenerators, is feasible without any problems. Furthermore, this allows continuous automatic monitoring, which is no longer based on empirical values or trained personnel.

In accordance with an added feature of the invention, the received pulses are advantageously processed in a signal filter. The signal filter makes it possible to filter out electromagnetic pulses in specific frequency bands and allows restriction to a pulse magnitude range which can be predetermined. In consequence, pulses which can in no way be due to disconnection of the protection device can be filtered out from the start.

In accordance with an additional feature of the invention, the received pulses are analyzed in an analyzer. The analyzer may be in the form of a separate unit, or software. The received pulses are checked in the analyzer. It is possible to carry out either a check for unacceptable electromagnetic pulses or a comparison with values entered in advance. Both procedures allow reliable identification of the electromagnetic pulses produced in the protection device on disconnection.

According to an advantageous development, the result of the analysis of the received pulses, or the received pulses, is/are buffer-stored for a specific time period in a buffer store. The buffer store allows only short-term storage of the results of the analysis or of the received pulses, and may thus be designed to be small.

The buffer store is advantageously overwritten once the specific time period has elapsed. This reduces the total memory space required.

In one advantageous development, the specific time period corresponds to the revolution duration of the rotating shaft, or to an integer multiple of it. This allows matching to the cyclic profile of the electromagnetic pulses from the other components.

On identification of the disconnection of a protection device, an associated signal is advantageously stored in a read only memory. The read only memory is required only when disconnection of a protection device is actually identified, and it can thus be designed to be small. If designed suitably, a single read only memory can be provided, which is connected to a number of buffer stores. This reduces the complexity and costs. At the same time, access by a user is simplified, since only one read only memory need be checked.

The at least one antenna can at least partially surround the protection device. The antenna is advantageously designed to be stationary. If the protection device is arranged on a rotating shaft, then the antenna surrounds the rotating shaft.

In accordance with another feature of the invention, the antenna is formed as a one-piece integral component. For installation, it is bent around the protection device, and is fixed.

In the apparatus according to the invention, the antenna in another advantageous refinement is composed of a number of circular-arc segments, which engage around the protection device. The individual segments of the antenna can be fitted quickly and easily. Retrofitting in already existing systems is also feasible, without any difficulties.

In accordance with a further feature of the invention, the circular-arc segments are electromagnetically isolated from one another. Each of the segments then acts as a single antenna. Depending on the mutual position of the protection device which is being disconnected and of the segments, the electromagnetic pulses produced on disconnection are received by at least one segment. By comparison of the intensities of the pulses received by the segments, it is possible to determine the distance between the protection device which is being disconnected and the individual segments. This allows accurate localization of the disconnected protection device.

According to one advantageous refinement, a number of antennas are provided, and are axially separated from one another. The axial separation between the antennas allows a number of protection devices or protection device groups arranged axially along the rotating shaft to be monitored simultaneously and reliably.

On disconnection, the axial position of the disconnected protection device is determined unambiguously.

According to one advantageous development, the antenna is shielded from the environment. Interference signals from the environment, such as other switching processes, are then not received. This avoids corruption from external influences.

An encoder is advantageously provided in order to detect the rotation position of the shaft. Particularly in conjunction with circular-arc segments which are electromagnetically isolated from one another, the encoder makes it possible to determine exactly which protection device has been disconnected.

In accordance with a concomitant feature of the invention, a data processing system is provided for analysis, checking and storage of the received pulses. The data processing system can be matched quickly and easily to different boundary conditions, such as the rotation speed of the rotating shaft.

Other features which are considered as characteristic for the invention are set forth in the appended claims.

Although the invention is illustrated and described herein as embodied in a method and apparatus for identification of the disconnection of a protection device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a three-phase bridge circuit for a rectifier;

FIG. 2 is a schematic longitudinal section through an exciter machine;

FIG. 3a is an enlarged sectional view taken along the line III—III in FIG. 2;

FIG. 3b is a similar view of a further embodiment;

FIG. 4 is a schematic illustration of the machine voltage UN, the arc voltage $U_B$, and the disconnection current I; and FIG. 5. is a diagrammatic and schematic illustrating signal processing according to the invention.

DESCRIPTION OF THE PREFERRED EMBODIMENTS

Referring now to the figures of the drawing in detail and first, particularly, to FIG. 1 thereof, there is seen a schematic of a three-phase bridge circuit. The three-phase current is fed in via three phases 11, 12, 13, and is intended to be converted to direct current. Six diodes 14a, 14b, 15a, 15b, 16a, 16b, are used for conversion and are connected in series with a respective protection device 17a, 17b, 18a, 18b, 19a, 19b. In the illustrated circuit, the diodes 14a, 15a, 16a can each pass the positive half-cycle of the alternating voltage $U_1$, and are reverse-biased in the opposite direction. The negative half-cycle of the alternating voltage $U_1$ is passed via the diodes 14b, 15b, 16b. There is then a DC voltage $U_2$ across a load resistance $R_L$. The load resistance $R_L$ is shown as a non-reactive resistance, but may also include inductances.

An antenna 20 is arranged in the vicinity of the protection devices 17a, 17b, 18a, 18b, 19a, 19b. Dashed lines show that this antenna 20 at least partially surrounds the protection devices 17a, 17b, 18a, 18b, 19a, 19b. If, for example, the protection device 17a is disconnected due to breakdown of the diode 14a, then electromagnetic pulses are produced, and are received by the antenna 20. The antenna 20 also receives further electromagnetic pulses, of course, but these clearly differ from the disconnection pulses.

Referring now to FIG. 2, there is shown a schematic longitudinal section through an exciter machine 21. The exciter machine 21 has a shaft 22, which is mounted in bearings 23, 24 such that it can rotate about its longitudinal axis 25. A main exciter 26 and an auxiliary exciter 27 act on the shaft 22. The stators 26a, 27a are mounted such that they are stationary on a housing which is not illustrated in any more detail. The rotors 26b, 27b are connected to the shaft 22, such that they rotate with it. Rectifier wheels 28, 29 are used to produce the desired DC voltage and are connected to the shaft 22, such that they rotate with it, and are axially separated from another. The protection devices 17a, 18a, 19a are advantageously accommodated in the first rectifier wheel 28, and the protection devices 17b, 18b, 19b are disposed in the second rectifier wheel 29. The two rectifier wheels 28, 29 are at least partially surrounded by antennas 20, 30.

At its left-hand end in FIG. 2, the shaft 22 has a coupling 31 for connection of other machines. A projection 45 is formed at the opposite end of the shaft 22. The projection 45 moves past an encoder 32 during rotation of the shaft 22. The encoder 32 not only makes it possible to monitor the rotation speed of the shaft 22 but, together with the antennas 20, 30, also makes it possible to determine the respective protection device 17a, 17b, 18a, 18b, 19a, 19b which is being disconnected.

The cross section shown in FIG. 3a illustrates the construction and arrangement of the antenna 20 in more detail. The antenna 20 is composed of three circular-arc segments 20a, 20b, 20c. The segments 20a, 2b, 20c are electromagnetically isolated from one another. The position of the protection devices 17a, 18a, 19a is illustrated schematically. If, for example, the protection device 17a is disconnected, then the segment 20c receives a very much stronger signal than the segments 20a, 20b. Since the rotation position of the shaft 22 is detected at the same time via the encoder 32, it is possible to determine unambiguously which protection device 17a, 18a, 19a was located directly alongside the segment 20c at the time of disconnection. This makes it possible to determine the disconnected protection device 17a, 18a, 19a.

FIG. 3b shows an one-piece antenna 46. For installation, the antenna 46 is bent around the rectifier wheel 28 and is then fixed. Interference signals from the environment are kept away by a shield 48.

FIG. 4 shows a schematic illustration of a disconnection process. No disconnection takes place before the time to. The machine voltage $U_N$ has a uniform, cyclic profile. One of the breakers 17a, 17b, 18a, 18b, 19a, 19b is disconnected at the time $t_0$. The arc voltage $U_B$ produced on disconnection has a considerably greater amplitude than the machine voltage $U_N$. A relatively high disconnection current I flows at the same time. Shortly after disconnection, the arc voltage $U_B$ collapses. The disconnection current I returns to 0. The machine voltage $U_N$ is now present once again.

The arc voltage $U_B$ and the disconnection current I produce electromagnetic pulses, which clearly differ from those during normal operation. These pulses are received by the antennas 20, 30, together with pulses emitted from other components, and are checked for electromagnetic pulses produced on disconnection of the protection device 17a, 17b, 18a, 18b, 19a, 19b.

FIG. 5 shows a schematic overview of the signal processing. The protection device 17a is surrounded by the antenna 20. In the event of a defect in the diode 14a, the protection device 17a is disconnected, and emits electromagnetic pulses 33. These pulses 33 are received by the antenna 20. The antenna 20 receives further electromagnetic pulses 34 which are produced by semiconductor components 47, in particular rotating or stationary diodes or thyristors. Semiconductor components such as these are arranged, inter alia, in the circuits of the main exciter 26. The pulses 33, 34 received by the antenna 20 are transmitted to a receiver 35. From there, they are passed on to a signal filter 36. The signal filter 36 passes only those pulses which are in a specific frequency band and have a specific pulse magnitude, both of which can be predetermined. In consequence, interference pulses which have been received by the antenna 20 are filtered out. Pulses that occur normally during operation can be filtered out at the same time.

The filtered pulses are analyzed in an analyzer 37, and are checked for electromagnetic pulses 33 occurring on disconnection of the protection device 17a. The analyzer 37 is likewise supplied with the rotation position of the shaft 22, detected by the encoder 32. The rotation position of the shaft 22 is linked to the pulses passed to the analyzer 37, and thus makes it possible to determine accurately which protection device has been disconnected. The result of the analysis or the pulses transferred to the analyzer 37 is or are then stored in a buffer store 38. If disconnection of the protection device 17a is identified, then an appropriate signal is stored in a non-volatile memory 39. This disconnection signal can also be emitted directly by the analyzer 37 to the memory 39, as illustrated by the signal arrow 43, in the form of dashed lines.

A control module 40 is used to control and monitor the process. The control module 40 is connected to the analyzer 37, to the buffer store 38 and to the read only memory 39 which together form a data processing system 42—after "memory 39" and before "the period". Connection to the encoder 32 is also possible, as illustrated by the signal arrow 44 in the form of dashed lines. If disconnection is identified, a corresponding indication is produced on an output module 41. The output module 41 can be actuated by the control module 40, the read only memory 39 or both. Alternatively or additionally, actuation by the analyzer 37 is also possible. The buffer store 38 is overwritten automatically once a specific time period has elapsed. The specific time period may correspond to the revolution duration of the rotating shaft 22, or to an integer multiple of it. Information about the disconnection can then be taken from the non-volatile memory 39 or from the control module 40.

The apparatus according to the invention is physically simple and can be retrofitted into existing systems. It allows automatic monitoring and identification of the disconnection of a protection device even without experienced personnel. Furthermore, the apparatus according to the invention operates without contact, and is thus subject to little wear and has a long life.

I claim:

1. A method of identifying a disconnection of a current protection device, which comprises:

placing the current protection device on a rotatable shaft and connecting the protection device in series with a semiconductor component, receiving, with an antenna, electromagnetic pulses emitted from the current protection device and checking for electromagnetic pulses produced during disconnection of the protection device; and detecting a rotation position of the shaft via an encoder and linking the rotation position to the received electromagnetic pulses.

2. The method according to claim 1, which comprises processing the received pulses in a signal filter.

3. The method according to claim 1, which comprises analyzing the received pulses in an analyzer.

4. The method according to claim 3, which comprises one of buffer-storing a result of the analyzing step and the received pulses for a specific time period in a buffer store.

5. The method according to claim 4, which comprises overwriting the buffer store once the specific time period has elapsed.

6. The method according to claim 4, wherein the specific time period corresponds to a revolution duration of the rotating shaft.

7. The method according to claim 4, wherein the specific time period corresponds to an integer multiple of a revolution duration of the rotating shaft.

8. The method according to claim 1, which further comprises, on identification of the disconnection of the protection device, storing an associated signal in a non-volatile memory.

9. An apparatus for identifying a disconnection of a current protection device, comprising:

at least one antenna disposed in a vicinity of the current protection device arranged on a rotating shaft and connected in series with a semiconductor component, said antenna being composed of a plurality of circular-arc segments surrounding the current protection device; and being electromagnetically isolated from one another; wherein said antenna receiving electromagnetic pulses produced during a disconnection of the current protection device; and an encoder disposed to detect a rotation position of the shaft.

10. The apparatus according to claim 9, wherein said antenna surrounds the protection device at least partially.

11. The apparatus according to claim 9, wherein said antenna is a one-piece antenna.

12. The apparatus according to claim 9, wherein said antenna is one of a plurality of antennas disposed at an axial spacing distance from one another.

13. The apparatus according to claim 9, wherein said antenna is shielded from an environment.

14. The apparatus according to claim 9, which comprises a data processing system connected to said antenna for analyzing, checking, and storing the received pulses.

* * * * *